(12) United States Patent
Visser

(10) Patent No.: US 6,753,941 B2
(45) Date of Patent: Jun. 22, 2004

(54) LITHOGRAPHIC APPARATUS AND DEVICE MANUFACTURING METHOD

(75) Inventor: Hugo Matthieu Visser, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 10/266,301

(22) Filed: Oct. 8, 2002

(65) Prior Publication Data

US 2003/0071979 A1 Apr. 17, 2003

(30) Foreign Application Priority Data

Oct. 12, 2001 (EP) .............................................. 01203899

(51) Int. Cl.[7] .................. G03B 27/52; G03B 27/42; G21K 5/00
(52) U.S. Cl. .................. 355/30; 355/53; 378/34
(58) Field of Search ................ 355/30, 53; 378/34; 359/509

(56) References Cited

U.S. PATENT DOCUMENTS

| | | | | |
|---|---|---|---|---|
| 5,305,364 A | * | 4/1994 | Mochiji et al. | ............... 378/34 |
| 6,108,397 A | | 8/2000 | Cash, Jr. | ....................... 378/34 |
| 6,252,648 B1 | | 6/2001 | Hase et al. | ................... 355/53 |
| 6,522,384 B2 | * | 2/2003 | Miwa | .......................... 355/30 |
| 6,559,922 B2 | * | 5/2003 | Hansell et al. | ................ 355/30 |
| 6,566,668 B2 | * | 5/2003 | Rauch et al. | ........... 250/504 R |

FOREIGN PATENT DOCUMENTS

| | | | | |
|---|---|---|---|---|
| EP | 0532960 A1 | 3/1993 | ............. | G03F/7/20 |
| WO | WO0199143 | 12/2001 | ............ | H01J/35/20 |

\* cited by examiner

Primary Examiner—Alan Mathews
(74) Attorney, Agent, or Firm—Peter Zawilski

(57) ABSTRACT

A lithographic projection apparatus comprises a contaminant trap (10) for trapping debris from the radiation source (LA) or from the resist (RL) on a substrate (W), which trap comprises two sets (11,12) of channels (20,21:30,31) arranged radially around the optical axis of the projection beam (PB) with a space (13) between them. Gas is supplied to the space. The flow resistance of the channels ensures that the gas pressure outside the trap (10) is much lower then that inside.

14 Claims, 2 Drawing Sheets

LITHOGRAPHIC APPARATUS AND DEVICE MANUFACTURING METHOD

The present invention relates to a lithographic projection apparatus comprising:
- a radiation system for supplying a projection beam of radiation;
- a support structure for supporting patterning means, the patterning means serving to pattern the projection beam according to a desired pattern;
- a substrate table for holding a substrate;
- a projection system for projecting the patterned beam onto a target portion of the substrate;
- at least one chamber enclosing at least part of at least one of the radiation system, the patterning means, the substrate and the projection system, and
- a contaminant trap arranged in the path of the projection beam.

The invention also relates to a method for manufacturing devices, which method uses the apparatus.

The term "patterning means" as here employed should be broadly interpreted as referring to means that can be used to endow an incoming radiation beam with a patterned cross-section, corresponding to a pattern that is to be created in a target portion of the substrate. Generally, the said pattern will correspond to a particular functional layer in a device being created in the target portion, such as an integrated circuit or other device (see below). Examples of such patterning means include:

a mask. The concept of a mask is well known in lithography, and it includes mask types such as binary, alternating phase-shift, and attenuated phase-shift, as well as various hybrid mask types. Placement of such a mask in the radiation beam causes selective transmission (in the case of a transmissive mask) or reflection (in the case of a reflective mask) of the radiation impinging on the mask, according to the pattern on the mask. In the case of a mask, the support structure will generally be a mask table, which ensures that the mask can be held at a desired position in the incoming radiation beam, and that it can be moved relative to the beam if so desired.

a programmable mirror array. An example of such a device is a matrix-addressable surface having a visco-elastic control layer and a reflective surface. The basic principle behind such an apparatus is that (for example) addressed areas of the reflective surface reflect incident radiation as deflected radiation, whereas non-addressed areas reflect incident radiation as non-deflected radiation. Using an appropriate filter, the said non-deflected radiation can be filtered out of the reflected beam, leaving only the deflected radiation behind; in this manner, the beam becomes patterned according to the addressing pattern of the matrix-addressable surface. The required matrix addressing can be performed using suitable electronic means. More information on such mirror arrays can be gleaned, for example, from U.S. Pat. Nos. 5,296,891 and 5,523,193, which are incorporated herein by reference. In the case of a programmable mirror array, the said support structure may be embodied as a frame or table, for example, which may be fixed or movable as required.

a programmable LCD array. An example of such a construction is given in U.S. Pat. No. 5,229,872, which is incorporated herein by reference. As above, the support structure in this case may be embodied as a frame or table, for example, which may be fixed or movable as required.

For purposes of simplicity, the rest of this text may, at certain locations, specifically direct itself to examples involving a mask and mask table; however, the general principles discussed in such instances should be seen in the broader context of the patterning means as hereabove set forth.

Lithographic projection apparatus can be used, for example, in the manufacture of integrated circuits (ICs). In such a case, the patterning means may generate a circuit pattern corresponding to an individual layer of the IC. This circuit pattern can be imaged onto a target portion (e.g. comprising one or more dies) on a substrate (silicon wafer) that has been coated with a layer of radiation-sensitive material (resist). In general, a single wafer will contain a whole network of adjacent target portions that are successively irradiated via the projection system, one at a time. In current apparatus, employing patterning by a mask on a mask table, a distinction can be made between two different types of machine. In one type of lithographic projection apparatus, each target portion is irradiated by exposing the entire mask pattern onto the target portion in one go; such an apparatus is commonly referred to as a wafer stepper. In an alternative apparatus—commonly referred to as a step-and-scan apparatus—each target portion is irradiated by progressively scanning the mask pattern under the projection beam in a given reference direction (the "scanning" direction) while synchronously scanning the substrate table parallel or anti-parallel to this direction. Since, in general, the projection system will have a magnification factor M (generally <1), the speed V at which the substrate table is scanned will be a factor M times that at which the mask table is scanned. More information with regard to lithographic devices as here described can be gleaned, for example, from U.S. Pat. No. 6,046,792, incorporated herein by reference.

In a manufacturing process using a lithographic projection apparatus, a pattern (e.g. in a mask) is imaged onto a substrate that is at least partially covered by a layer of radiation-sensitive material (resist). Prior to this imaging step, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g. an IC. Such a patterned layer may then undergo various processes such as etching, ion-implantation (doping), metallization, oxidation, chemo-mechanical polishing, etc., all intended to finish off an individual layer. If several layers are required, then the whole procedure or a variant thereof, will have to be repeated for each new layer. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-067250-4, incorporated herein by reference.

The term "the projection system" should be broadly interpreted as encompassing various types of projection system, including refractive optics, reflective optics, and catadioptric systems, for example. The radiation system may also include components operating according to any of these design types for directing, shaping or controlling the projection beam of radiation. Further, the lithographic apparatus may be of a type having two or more substrate tables (and/or two or more mask tables). In such "multiple stage" devices the additional tables may be used in parallel or preparatory steps may be carried out on one or more tables while one or more other tables are being used for exposures. Twin stage lithographic apparatus are described, for example, in U.S. Pat. No. 5,969,441 and WO 98/40791, incorporated herein by reference.

In order to be able to image smaller features, it has been proposed to use extreme ultraviolet radiation (EUV) with a wavelength in the range of 5 to 20 nm, particularly 13 nm, or a charged particle beam, e.g. an ion beam and an electron beams, as the exposure radiation in a lithographic apparatus. These types of radiation require that the beam path in the apparatus be evacuated to avoid beam scatter and absorption. Because there is no known material suitable for making a refractive optical element for EUV radiation, EUV lithographic apparatus must use mirrors in the radiation (illumination) and projection systems. Even multilayer mirrors for EUV radiation have relatively low reflectivity's and are highly susceptible to contamination, further reducing their reflectivity's and hence throughput of the apparatus. This imposes further requirements on the vacuum level that must be maintained and necessitates especially that hydrocarbon partial pressures be kept very low.

At the same time, plasma radiation sources and the resist are substantial sources of contaminants that must be kept out of the illumination and projection systems. A discharge plasma source, for example, uses a discharge to create very hot partially ionized plasma, which emits EUV radiation. The plasma gas, which is often xenon (Xe), and debris from the source must be kept from entering the illumination system. At the other end of the apparatus, the radiation incident on the resist to expose it causes ejection of debris and by-products by a sputtering process. It is necessary to prevent both source and resist debris from reaching the illumination and projection systems.

EP-A-0 957 402, incorporated herein by reference, discloses a system for preventing resist debris entering the projection system. This system comprises a simple tube, preferably conical, which surrounds the projector beam between the projection system enclosure and the substrate. A gas flow in the tube entrains resist debris to prevent it entering the projection system enclosure.

WO 99/42904, incorporated herein by reference, discloses a contaminant trap, called filter, for trapping source debris which comprises a plurality of foils or plates, which may be flat or conical and are arranged radial around the radiation source. The source, the filter and the projection system may be arranged in a buffer gas, for example krypton whose pressure is 0,5 Torr. The contaminant particles then take on the temperature of the buffer gas, for example room temperature thereby sufficient reducing the particles velocity before they enter the filter. The pressure in the known contamination trap is equal to that of its environment. This trap is arranged at 2 cm from the source and its plates have a length, in the propagation direction of the radiation, of at least 1 cm and preferably 7 cm. This design requires relative large and thus costly collecting and guiding/shaping optics to bundle and shape the source radiation and guide it to the mask.

It is an object of the present invention to provide an improved device for trapping debris, such as may be emitted by a plasma source or from resist exposed to EUV radiation.

This and other objects are achieved according to the invention in a lithographic apparatus as defined in the opening paragraph, which is characterized in that contaminant trap comprises at least two sets of channels arranged substantially parallel to the direction of propagation of said projection beam, which sets are spaced apart from each other along an optical axis of said projection beam, and means for supplying a flushing gas to the space between said two sets of channels.

A channel is understood to mean an elongated portion of space wherein a portion of the projection beam propagates. Plate members or foils separate such a channel from neighboring channels.

By providing two sets of channels, effectively forming two particle traps, and supplying gas to the space between them, a high gas pressure to trap the contaminant particles can be achieved, whilst the high flow resistance of the particle traps ensures that leakage is minimized. The new trap design allows the gas pressure in the trap to be orders of magnitude higher than outside the trap. The trap efficiency is increased considerably, which allows the trap to be considerably shorter, i.e. more compact so that the size and costs of the collecting optics can be decreased considerably. If sufficient exhaust pumping capacity is provided, the pressure outside the trap can be kept at least 10 or 100 times less than the pressure inside the trap.

In order to provide sufficient resistance to gas flow to maintain the pressure differential between the space between the two sets of channels and outside the trap, the channels defined by the plate member preferably have an aspect ratio (length/width) of greater than 8.

Preferably, the flow of gas through the traps is sufficiently fast that the volume of the trap is emptied by the exhaust pumps in less than, preferably less than half, the mean time taken for a gas molecule to diffuse through either one of the sets of channels. In this way, it is possible to ensure that contaminant particles that do not stick to the plate members or foils of the channels are entrained and exhausted with the flow of flushing gas.

The contaminant trap can be used between a radiation source and the illumination system comprised in said radiation system to capture source debris, especially where the source is a plasma source.

The invention also relates to a device manufacturing method comprising the steps of:

providing a substrate that is at least partially covered by a layer of radiation-sensitive material;

providing a projection beam of radiation using a radiation system;

removing contaminant particles from the projection beam using a contaminant trap;

using patterning means to endow the projection beam with a pattern in its cross-section;

projecting the patterned beam of radiation onto a target portion of the layer of radiation-sensitive material. This method is characterized in that the step of removing contaminant particles comprises sending the projection beam successively through at least two sets of channels, which are spaced apart from each other in the direction of propagation of the projection beam and supplying a flushing gas to the space between the said two sets of channels.

Although specific reference may be made in this text to the use of the apparatus according to the invention in the manufacture of ICs, it should be explicitly understood that such an apparatus has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle", "wafer" or "die" in this text should be considered as being replaced by the more general terms "mask", "substrate" and "target portion", respectively.

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range 5–20 nm).

Embodiments of the invention will now be described, by way of example only, with reference to the accompanying schematic drawings in which.

In the Figures, corresponding reference symbols indicate corresponding parts.

Figure 1:
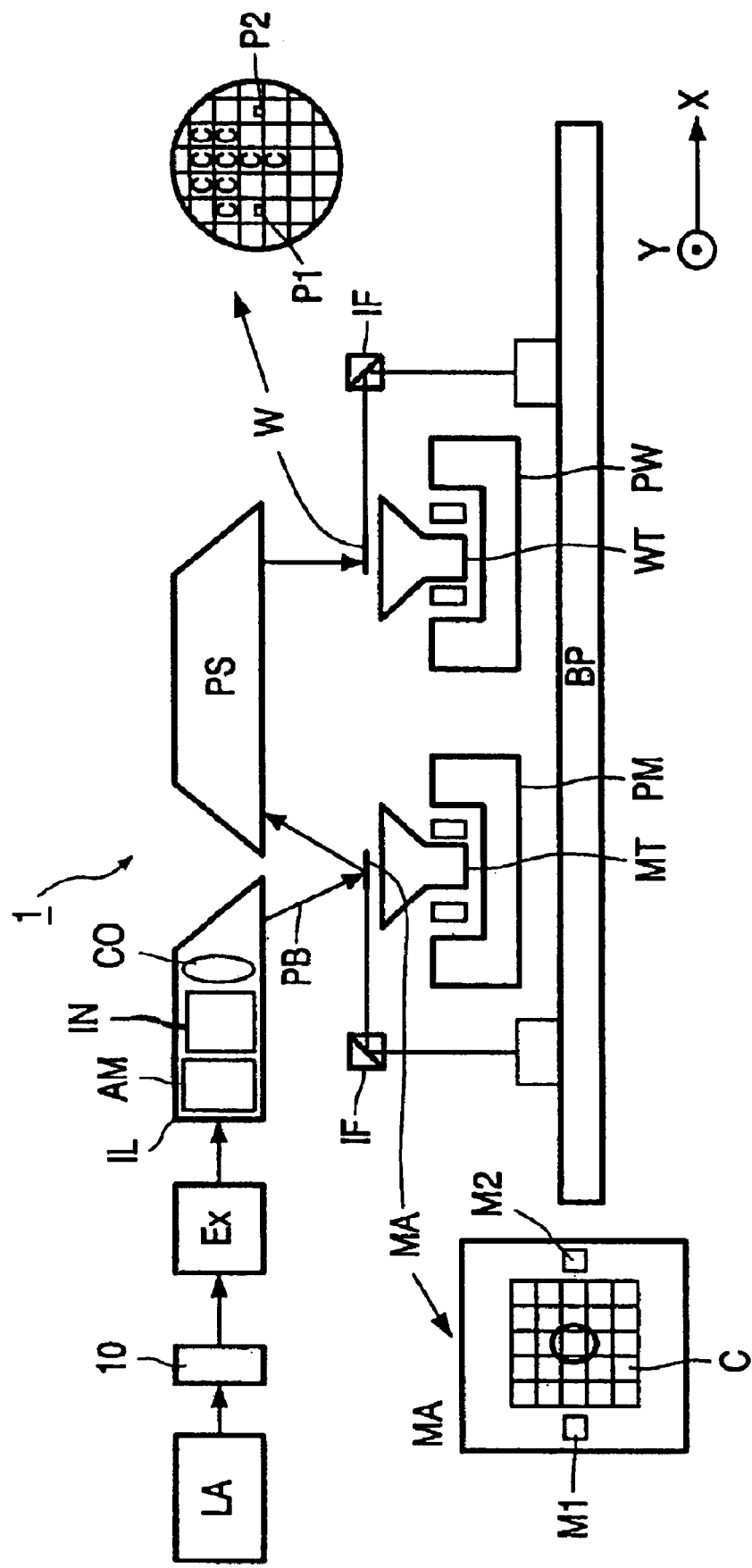
FIG. 1 depicts a lithographic projection apparatus according to an embodiment of the invention.

FIG. 1 schematically depicts a lithographic projection apparatus according to a particular embodiment of the invention. The apparatus comprises:

a radiation system Ex, IL, for supplying a projection beam PB of radiation (e.g. EUV radiation), which in this particular case also comprises a radiation source LA;

a first object table (mask table) MT provided with a mask holder for holding a mask MA (e.g. a reticle), and connected to first positioning means PM for accurately positioning the mask with respect to, for example item PS or item W;

a second object table (substrate table) WT provided with a substrate holder for holding a substrate W (e.g. a resist-coated silicon wafer), and connected to second positioning means PW for accurately positioning the substrate with respect to, for example item PL or the mask MA;

a projection system PS (e.g. a mirror group) for imaging an irradiated portion of the mask MA onto a target portion C (e.g. comprising one or more dies) of the substrate W. As here depicted, the apparatus is of a reflective type (i.e. has a reflective mask). However, in general, it may also be of a transmission type, (i.e. has a transmission mask, for example). Alternatively, the apparatus may employ another kind of patterning means, such as a programmable mirror array of a type as referred to above.

The source LA (e.g. a discharge or laser-produced plasma source) produces a beam of radiation. This beam is fed into an illumination system (illuminator) IL, either directly or after having traversed conditioning means, such as a beam expander Ex, for example. The illuminator IL may comprise adjusting means AM for setting the outer and/or inner radial extent (commonly referred to as σ-outer and σ-inner, respectively) of the intensity distribution in the beam. In addition, it will generally comprise various other components, such as an integrator IN and a condenser CO. In this way, the beam PB impinging on the mask MA has a desired uniformity and intensity distribution in its cross-section.

It should be noted with regard to FIG. 1 that the source LA may be within the housing of the lithographic projection apparatus (as is often the case when the source LA is a mercury lamp, for example). The source may also be remote from the lithographic projection apparatus, the radiation beam which it produces being led into the apparatus (e.g. with the aid of suitable directing mirrors). This latter scenario is often the case when the source LA is an excimer laser. The current invention and Claims encompass both of these scenarios.

The beam PB subsequently intercepts the mask MA, which is held on a mask table MT. The beam which has been selectively reflected by the mask MA, passes through the projection system PS, which focuses the beam PB onto a target portion C of the substrate W. With the aid of the second positioning means PW (and interferometric measuring means IF), the substrate table WT can be moved accurately, e.g. so as to position different target portions C in the path of the beam PB. Similarly, the first positioning means PM can be used to accurately position the mask MA with respect to the path of the beam PB, e.g. after mechanical retrieval of the mask MA from a mask library, or during a scan. In general, movement of the object tables MT, WT will be realized with the aid of a long-stroke module (course positioning) and a short-stroke module (fine positioning), which are not explicitly depicted in FIG. 1. However, in the case of a wafer stepper (as opposed to a step-and-scan apparatus) the mask table MT may just be connected to a short stroke actuator, or may be fixed.

The depicted apparatus can be used in two different modes:

1. In step mode, the mask table MT is kept essentially stationary, and an entire mask pattern is projected in one go (i.e. a single "flash") onto a target portion C. The substrate table WT is then shifted in the x and/or y directions so that a different target portion C can be irradiated by the beam PB;

2. In scan mode, essentially the same scenario applies, except that a given target portion C is not exposed in a single "flash". Instead, the mask table MT is movable in a given direction (the so-called "scan direction", e.g. the y direction) with a speed v, so that the projection beam PB is caused to scan over a mask image. Concurrently, the substrate table WT is simultaneously moved in the same or opposite direction at a speed V=Mv, in which M is the magnification of the projection system PS (typically, M=¼ or ⅕). In this manner, a relatively large target portion C can be exposed, without having to compromise on resolution of the projection system.

In case the radiation source is an EUV emitting plasma source, for example a laser produced plasma source or a discharge plasma source, a contaminant trap 10 is arranged close to the source, as shown in FIG. 1. This trap should prevent debris, i.e. contaminant particles thrust by the source from reaching optical components of the radiation system and of the illumination system. A contaminant trap 10 according to the invention is shown in cross-section in FIG. 2. It comprises a first set 11 and a second set of plate-like members or foils, which are arranged radially around the optical axis OA of the projection beam PB emitted by source LA. The plates of the first and second set define a first set of channels 11 and a second set of channels 12, respectively. For clearness sake, in FIG. 2 only two channels 20,21 and 30,31 of the first set and two channels 30, 31 of the second set are shown. The two sets of channels 11, 12 are spaced apart leaving between them a space 13 into which flushing gas is supplied by gas supply 14. An exhaust system 15 may be provided to remove gas from the contaminant trap 10, the removed gas may be cleaned by scrubber 16 and recycled to the gas supply 13. The flushing gas may be an inert gas, e.g. Argon, and is preferably chosen to have minimum absorption at the wavelength of the projection beam. Exhaust system 15 will generally comprise pumps connected to chambers adjacent contaminant trap 10.

The projection beam PB passes successively through the first set of channels 11 and the second set of channels 12. The channels preferably have a length/width ration of, for example 8 or larger. The plate-like members are preferably made as thin as possible to minimize the amount of radiation from the beam absorbed and may be made of metal foil, supported as necessary by a frame. Preferably, the channels of the first set 11 are aligned to those of the second set 12.so that the downstream plates lie in the shadows of the upstream plates.

The narrowness of the channels defined by the plate-like members provides a substantial flow resistance to the gas supplied to the space 13 and minimizes leakage into the remainder of the apparatus. As an example, the average width of the channels may be 1 mm, their height and length 20 mm and the total area of the channel openings may be 100 cm². The gas flow conductance of the channel structure, or its resistance to gas flow, can be derived as follows. It shows that the result of the division of, for example an opening in a vacuum chamber wall, in a number of adjacent channels drastically reduces the conductance of the opening. In a simplified calculation, which is accurate within approximately 10%, the conductance $C_T$ of the channel structure can be written as:

$$C_T = C_M + C_V$$

where $C_M$ represents the molecular conductance and $C_V$ the laminar conductance. A further background for such calculations can be found in "Foundations of Vacuum Science and Technology", edited by J. M. Lafferty, Wiley & Sons Inc., 1998, ISBN 0-471-17593-5. For high Knudsen numbers (>0,5) $C_M$ dominates, whereas $C_V$ dominates for low Knudsen numbers. In the so-called transition regime, which is the case for the situation considered, both contributions have to be taken into account.

Figure 2:
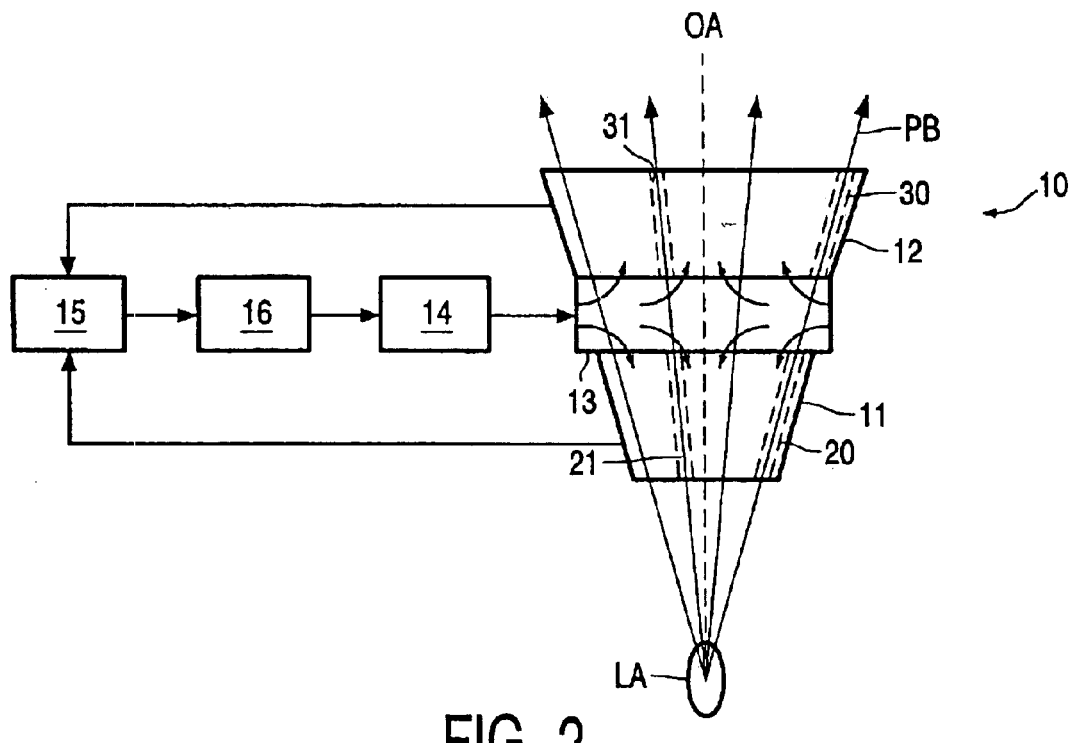
FIG. 2 depicts a contaminant trap according to the invention arranged about the radiation source.

In case in the structure of FIG. 2 the total area of the channel openings is 100 cm² and the channels are approximately 20 mm long, 0,5 mm wide in the tangential direction and 20 mm wide in the radial direction with respect to the optical axis, i.e. the axis of the beam, $C_M$=10 l/s, $C_V$=130 l/s. This gives a total conductance $C_T$=140 l/s for an average pressure in the channels of 0.05 mbar argon (0.1 mbar in space 13 and negligible pressure outside the trap). Thus, by removing the flushing gas using pumps with a capacity of 5600 l/s, the pressure outside of the trap can be maintained at 0.025 mbar and the flow through each set of channels will be 14 ml/s.

The contaminant trap according to the invention functions to trap contaminant particles in two ways. Firstly, the pressure of the gas in the channels ensures that the chance of a contaminant particle or molecule diffusing through the trap without contacting the channel walls is very small. Most contaminants will stick to the channel walls and the walls may be roughened and/or charged to encourage this. For particles that do not stick to the walls, the fact that the flow rate of gas is such that the trap is emptied in less than the average time for a molecule to diffuse through either set of channels means that such particles will probably be entrained and exhausted with the flushing gas flow. The contaminant trap and the flushing gas may be cooled to reduce diffusion rates.

Figure 3:
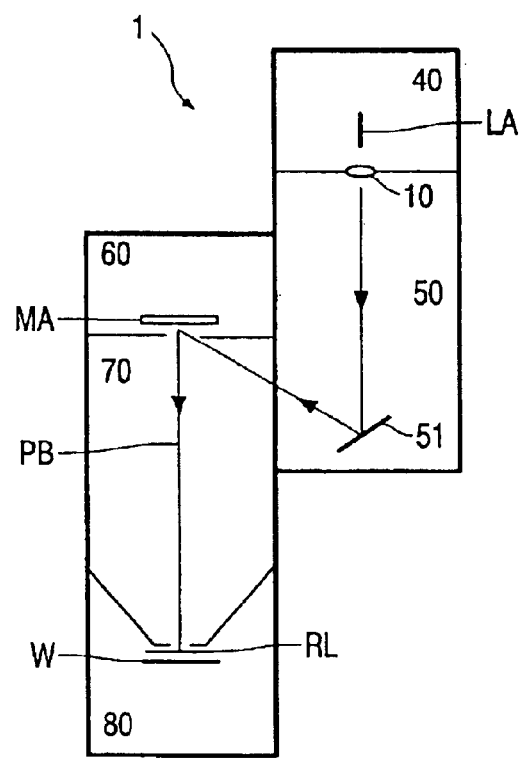
FIG. 3 depicts schematically the various vacuum chambers of an EUV lithographic projection apparatus.

The contaminant trap of the invention may be used, not only at the site of the radiation source, but also at other positions in the lithographic projection apparatus. As shown very schematically in FIG. 3, the various components of such an apparatus are distributed over a number of vacuum chambers. These chambers are separated by walls, in which windows are present for passing the projection beam from one vacuum chamber to the next one. FIG. 3 shows a source chamber 40 containing the source LA, an illumination optics chamber 50 containing a collecting mirror (not shown) and possibly further mirrors, like mirror 51, which determine the shape and vergence (convergence or divergence) of the projection beam, a projection optics chamber 70 containing the components of the projection system PS and a chamber 80 containing the substrate W. In the various chamber different vacuum levels may be maintained. The illumination and projection optics chambers require a high vacuum level to keep the optical path of the projection beam through these chambers transparent for this beam. Essential is also to prevent that contaminating particles enter these chambers and reach the optical components. Such particles would considerably reduce the reflectivity and quality of these components and thus would be detrimental for the performance of the projection apparatus. As discussed herein above, one kind of contamination stems from the EUV radiation source, which produces debris either by erosion of the electrodes and chamber walls, in case of a discharge plasma source, or by ions or particles from the plasma and the walls in case of a laser-produced plasma source. Another kind of contamination stems from the resist layer on the substrate, which layer produces organic vapor and other debris upon irradiation with the EUV projection beam. In general, a contaminant trap according to the invention may be arranged at positions where the projection beam enters and leaves a system of chambers of a lithographic projection apparatus. In case of an EUV apparatus, such a trap may be arranged between the radiation source LA and the illumination system IL or the beam expander Ex, when present, and between the projection system PL and the substrate W. A contaminant trap may also be arranged between two successive chambers to further reduce debris or contaminant particles in the projection beam.

For the same purpose, also two or more contaminant traps may be arranged in series at said positions.

Whilst specific embodiments of the invention have been described above, it will be appreciated that the invention may be practiced otherwise than as described. In particular, whilst the contaminant trap of the invention has been shown used to trap source debris, it will be appreciated that the contaminant trap may be used elsewhere in the lithography apparatus to trap debris from any other contamination source. Also, the trap can be varied in shape to conform to a converging or collimated beam as well as to a diverging beam, as shown. The description is not intended to limit the invention.

What is claimed is:

1. A lithographic projection apparatus comprising:
   a radiation system for providing a projection beam of radiation;
   a support structure for supporting patterning means, the patterning means serving to pattern the projection beam according to a desired pattern;
   a substrate table for holding a substrate;
   a projection system for projecting the patterned beam onto a target portion of the substrate;
   at least one chamber enclosing at least part of at least one of said radiation system, said support structure, said substrate and said projection system, and
   a contaminant trap arranged in the path of the projection beam, characterized in that the contaminant trap comprises at least two sets of open channels arranged substantially parallel to the direction of propagation of said projection beam, wherein each set includes a plurality of openings through which said projection beam can pass, and which sets are spaced apart from each other along an optical axis of said projection beam, and means for supplying a flushing gas to the space between said two sets of channels.

2. Apparatus according to claim 1, wherein at least one of said at least two sets of channels comprises channels arranged radially about said optical axis.

3. Apparatus according to claim 1, wherein said channels have lengths at least 8 times greater than their widths.

4. Apparatus according to claim 3, further comprising gas exhaust means for removing gas from said contaminant trap.

5. Apparatus according to claim 4, wherein said gas exhaust means has a pumping capacity sufficient to the conductivity of said first and second sets of channels such that the pressure of gas leaking from said contaminant trap is at least 10 times the pressure of gas in said space.

6. Apparatus according to claim 4, wherein said gas exhaust means has a pumping capacity such that the volume of said contaminant trap is emptied in a period less than the mean time for a gas molecule at ambient temperature to diffuse through either one of said first and second sets of channels.

7. Apparatus according to anyone of the preceding claims, wherein said contaminant trap is located between a radiation source and an illumination system comprised in said radiation system.

8. Apparatus according to claim 1, wherein the support structure comprises a mask table for holding a mask.

9. Apparatus according to claim 1 wherein said projection beam comprises EUV radiation.

10. A device manufacturing method comprising the steps of:
providing a substrate that is at least partially covered by a layer of radiation-sensitive material;
providing a projection beam of radiation using a radiation system;
removing contaminant particles from the projection beam using a contaminant trap;
using patterning means to endow the projection beam with a pattern in its cross-section; and
projecting the patterned beam of radiation onto a target portion of the layer of radiation-sensitive material, characterized in that the step of removing contaminant particles comprises sending the projection beam successively through at least two sets of open channels, wherein each set includes a plurality of openings through which said projection beam can pass, and which are spaced apart from each other in the direction of propagation of the projection beam and supplying a flushing gas to the space between the two sets of channels.

11. A method according to claim 10 comprising the further step of removing said flushing gas from said contaminant trap.

12. A method according to claim 11 wherein said step of removing gas is carried out at a rate sufficient to ensure that the pressure of gas escaping from said contaminant trap is at least 10 times the pressure in said space.

13. A method according to claim 11 wherein said step of removing gas is carried out at a rate such that the volume of said contaminant trap is emptied in less than the mean time taken for a gas molecule at ambient temperature to diffuse through either one of said two sets of channels.

14. A lithographic projection apparatus comprising:
a radiation system for providing a projection beam of radiation;
a support structure for supporting patterning means, the patterning means serving to pattern the projection beam according to a desired pattern;
a substrate table for holding a substrate;
a projection system for projecting the patterned beam onto a target portion of the substrate;
at least one chamber enclosing at least part of at least one of said radiation system, said support structure, said substrate and said projection system;
a contaminant trap arranged in the path of the projection beam, characterized in that the contaminant trap comprises at least two sets of channels arranged substantially parallel to the direction of propagation of said projection beam, which sets are spaced apart from each other along an optical axis of said projection beam, and means for supplying a flushing gas to space between said two sets of channels; and
gas exhaust means for removing gas from said contaminant trap, wherein said gas exhaust means has a pumping capacity such that the volume of said contaminant trap is emptied in a period less than the mean time for a gas molecule at ambient temperature to diffuse through either one of said first and second sets of channels.

* * * * *